(12) United States Patent
Medintz et al.

(10) Patent No.: US 8,921,140 B2
(45) Date of Patent: Dec. 30, 2014

(54) SIMULTANEOUS MODULATION OF QUANTUM DOT PHOTOLUMINESCENCE USING ORTHOGONAL FLUORESCENCE RESONANCE ENERGY TRANSFER (FRET) AND CHARGE TRANSFER QUENCHING (CTQ)

(71) Applicants: Igor L. Medintz, Springfield, VA (US); W. Russ Algar, Vancouver (CA); Michael H. Stewart, Springfield, VA (US); Kimihiro Susumu, Alexandria, VA (US)

(72) Inventors: Igor L. Medintz, Springfield, VA (US); W. Russ Algar, Vancouver (CA); Michael H. Stewart, Springfield, VA (US); Kimihiro Susumu, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/174,125

(22) Filed: Feb. 6, 2014

(65) Prior Publication Data
US 2014/0256073 A1 Sep. 11, 2014

Related U.S. Application Data

(62) Division of application No. 13/439,003, filed on Apr. 4, 2012, now Pat. No. 8,680,506.

(60) Provisional application No. 61/471,264, filed on Apr. 4, 2011.

(51) Int. Cl.
| | | |
|---|---|---|
| H01L 21/00 | (2006.01) | |
| H01L 33/06 | (2010.01) | |
| H01L 33/26 | (2010.01) | |
| H01L 51/56 | (2006.01) | |
| H01L 27/32 | (2006.01) | |

(52) U.S. Cl.
CPC .............. *H01L 33/06* (2013.01); *H01L 33/26* (2013.01); *H01L 51/56* (2013.01); *H01L 27/3244* (2013.01)
USPC .............. 438/35; 438/29; 438/22; 438/34; 257/13; 257/17; 257/E33.005; 257/E33.061

(58) Field of Classification Search
CPC ..... H01L 51/56; H01L 27/3244; H01L 33/32; H01L 33/06; H01L 29/155; H01L 27/3211; C09K 11/06; B82Y 20/00
USPC ...................... 438/29, 34, 35, 22; 257/13, 17, 257/E33.005, E33.061
See application file for complete search history.

(56) References Cited

U.S. PATENT DOCUMENTS 7,651,771 B2 * 1/2010 Meyer et al. .................. 428/403

* cited by examiner

*Primary Examiner* — Thinh T Nguyen
(74) *Attorney, Agent, or Firm* — US Naval Research Laboratory; Roy Roberts

(57) ABSTRACT

Quantum dots are modified with varying amounts of (a) a redox-active moiety effective to perform charge transfer quenching, and (b) a fluorescent dye effective to perform fluorescence resonance energy transfer (FRET), so that the modified quantum dots have a plurality of photophysical properties. The FRET and charge transfer pathways operate independently, providing for two channels of control for varying luminescence of quantum dots having the same innate properties.

9 Claims, 8 Drawing Sheets

Cy3-CST$R$IDEANQ$R$ATKLP$_7$SH$_6$

Ru-CAib$_6$G$_2$H$_6$

Ru-CST*R*IDEANQ*R*ATKLP$_7$SH$_6$

Cy3-CAib$_6$G$_2$H$_6$

SIMULTANEOUS MODULATION OF QUANTUM DOT PHOTOLUMINESCENCE USING ORTHOGONAL FLUORESCENCE RESONANCE ENERGY TRANSFER (FRET) AND CHARGE TRANSFER QUENCHING (CTQ)

CROSS-REFERENCE TO RELATED APPLICATIONS

This application is a divisional of U.S. application Ser. No. 13/439,003 filed on Apr. 4, 2012 which in turn claims the benefit of U.S. Provisional Application 61/471,264 filed on Apr. 4, 2011.

BACKGROUND

The introduction of luminescent semiconductor nanocrystals or quantum dots (QDs) to biology has provided researchers with novel fluorescent tools for potentially achieving advances in imaging and sensing. See, for example, U.S. Patent Application Publication Nos. 2008/0087843 and 2011/0089241, each of which is incorporated herein by reference. This arises from the unique photophysical properties that these fluorophores provide including: size-tunable narrow, symmetrical photoluminescence (PL, full-width at half-maximum ~25-40 nm) and broad absorption spectra that increase towards shorter wavelengths. Using different semiconductor materials it is possible to prepare nanocrystals with emissions ranging from the UV to the near infrared region of the optical spectrum. QDs also exhibit high quantum yields, a pronounced resistance to chemical degradation, and high photo-bleaching thresholds. A particularly useful property is that multiple QDs present in the same sample can be efficiently excited at a single wavelength far removed (>100 nm) from their respective emissions. This makes QDs directly amenable to signal multiplexing, i.e., the simultaneous detection of multiple concurrent fluorescent emissions or channels.

A need exists to control photophysical properties of quantum dots.

BRIEF SUMMARY

In a first embodiment, a method of modulating the photophysical properties of quantum dots includes contacting a uniform population of quantum dots with varying amounts of (a) a redox-active moiety effective to perform charge transfer quenching, and (b) a fluorescent dye effective to perform fluorescence resonance energy transfer, thereby obtaining modified quantum dots having a variety of photophysical properties.

In another embodiment, a method of modulating the photophysical properties of quantum dots includes providing a uniform population of modified quantum dots, the uniform population comprising quantum dots modified with (a) a redox-active moiety effective to perform charge transfer quenching, and (b) a fluorescent dye effective to perform fluorescence resonance energy transfer to produce a plurality of optical barcodes; and selectively removing the redox-active moiety and/or the fluorescent dye, thereby obtaining modified quantum dots having a variety of photophysical properties.

In a further embodiment, modified quantum dots include a population of quantum dots all substantially possessing the same innate photophysical properties, modified via varying amounts of (a) a redox-active moiety effective to perform charge transfer quenching, and (b) a fluorescent dye effective to perform fluorescence resonance energy transfer, so that the modified quantum dots have a plurality of photophysical properties.

BRIEF DESCRIPTION OF THE DRAWINGS

FIG. 2A shows the effect of assembling an increasing number of Ru moieties around a QD acting as FRET donor, as a function of the number of Cy3 FRET acceptors. FIG. 2B shows an example of the effect of increased assembly of Ru moieties on highly-efficient FRET between each QD and an average of sixteen Cy3 acceptors. FIGS. 2C and 2D show the effect of assembling an increasing amount of Cy3 on QDs which are: (i) unquenched by Ru or (ii) strongly quenched by Ru.

In FIG. 3A, proteolytic activity (scissors representing a proteolytic enzyme such as trypsin) drives dynamic modulation through the disruption of FRET. The peptide sequences are shown for reference. Trypsin cutting sites are highlighted in bold italics. FIG. 3B shows changes in QD PL intensity as a function of time and trypsin concentration. FIG. 3C shows changes in Cy3 PL as a function of time and trypsin concentration. FIG. 3D shows changes in FRET efficiency as a function of time and trypsin concentration. FIG. 3E shows combined QD and Cy3 PL intensity as a function time and trypsin concentration.

FIG. 4A illustrates proteolytic activity (scissors=trypsin) to drive dynamic modulation through the disruption of CTQ. The peptide sequences are shown for reference. Trypsin cutting sites are highlighted in bold italics. FIG. 4B shows changes in QD PL intensity as a function of time and trypsin concentration. FIG. 4C shows changes in Cy3 PL as a function of time and trypsin concentration. FIG. 4D shows changes in FRET efficiency as a function of time and trypsin concentration. FIG. 4E shows combined QD and Cy3 PL intensity as a function time and trypsin concentration.

DETAILED DESCRIPTION

Definitions

Figure 1B:
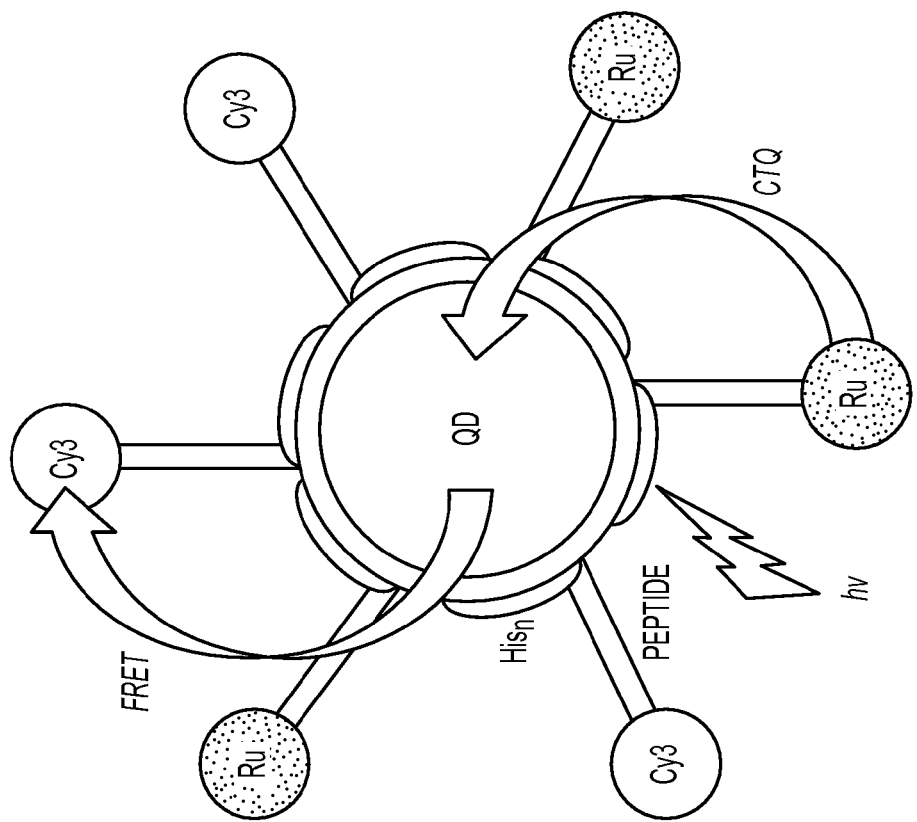
FIG. 1B shows an exemplary reduction of the technique to practice, using polyhistidine appended peptides ($His_n$, in this example n=6), labeled with either a Cy3 fluorescent dye or a ruthenium (Ru) phenanthroline redox-active moiety, to drive the peptide and Cy3/Ru assembly with a CdSe/ZnS QD.

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used in this specification and the appended claims, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

The term "quantum dot" or "QD" as used herein refers to an inorganic semiconductor crystallite of about 1 nm or more and about 1000 nm or less in diameter or any integer or fraction of an integer therebetween, preferably at least about 2 nm and about 50 nm or less in diameter or any integer or fraction of an integer therebetween, more preferably at least about 2 nm and about 20 nm or less in diameter (for example about 2, 3, 4, 5, 6, 7, 8, 9, 10, 11, 12, 13, 14, 15, 16, 17, 18, 19, or 20 nm). QDs are characterized by their substantially uniform nanometer size, frequently exhibiting approximately a 10% to 15% polydispersion or range in size. A QD is capable of emitting electromagnetic radiation upon excitation (i.e., the QD is photoluminescent) and includes a "core" of one or more first semiconductor materials, and may be surrounded by a "shell" of a second semiconductor material. A QD core surrounded by a semiconductor shell is referred to as a "core/shell" QD. The surrounding "shell" material will preferably have a bandgap energy that is larger than the bandgap energy of the core material and may be chosen to have an atomic spacing close to that of the "core" substrate.

The core and/or the shell can be a semiconductor material including, but not limited to, those of the groups II-VI (ZnS, ZnSe, ZnTe, US, CdSe, CdTe, HgS, HgSe, HgTe, MgS, MgSe, MgTe, CaS, CaSe, CaTe, SrS, SrSe, SrTe, BaS, BaSe, BaTe, and the like) and III-V (GaN, GaP, GaAs, GaSb, InN, InP, InAs, InSb, and the like) and IV (Ge, Si, and the like) materials, PbS, PbSe, and an alloy or a mixture thereof. Preferred shell materials include ZnS.

A QD is optionally surrounded by a "coat" of an organic capping agent. The organic capping agent may be any number of materials, but has an affinity for the QD surface. In general, the capping agent can be an isolated organic molecule, a polymer (or a monomer for a polymerization reaction), an inorganic complex, or an extended crystalline or amorphous structure. The coat can be used to convey solubility, e.g., the ability to disperse a coated QD homogeneously into a chosen solvent, functionality, binding properties, or the like. In addition, the coat can be used to tailor the optical properties of the QD. Thus, the quantum dots herein include a those having a simple core with or without a coated, as well as optionally coated core/shell QDs.

As used herein, the term "photophysical properties" includes absorption and emission spectra, quantum yield, fluorescence lifetime, and related properties as recognized by one of ordinary skill in the art.

As used herein, the term "uniform population" refers to a plurality having substantially similar photophysical properties.

As used herein, the "innate photophysical properties" of quantum dots refers to the photophysical properties of the quantum dots absent any effects due to FRET or charge transfer quenching.

As appreciated by one of ordinary skill in the art, "contacting" a quantum dot with a fluorescent dye effective to perform FRET does not necessarily require direct physical contact, as FRET is effective through space (albeit only over short distances). Likewise, one of ordinary skill in the art understands that "contacting" a quantum dot with a redox-active moiety effective to perform charge transfer can be done via a direct or indirect connection. In either case, contacting can include covalent bonding, ionic bonding, affinity binding (including polyhistidine/metal), and/or combinations thereof.

Description

Fluorescence resonance energy transfer (FRET) and charge transfer quenching (CTQ) (sometimes simply referred to as charge transfer) have been used as separate techniques to modulate the photoluminescence of quantum dots (QDs). While the individual modulation of QD luminescence via one of these interactions has been successful, the use of either FRET or CTQ by itself is limited in the ability to generate diverse photophysical properties from a population of quantum dots. For example, two different CTQ pathways cannot be discerned since both have the effect of quenching the QD luminescence. In the case of FRET, two pathways can only be discerned in the special case that two fluorescent dyes have spectral overlap with a QD donor but also have resolvable luminescence—a rarity given the small Stokes shift associated with most molecular dyes. Thus, in the vast majority of cases, the use of two (or more) FRET or CTQ pathways has relied on the use of two (or more) populations/colors of QD, with each color of QD designed with a different FRET or CTQ pathway.

As disclosed herein, the photoluminescence (PL) and other photophysical properties of semiconductor nanocrystals or "quantum dots" (QDs) can be controlled using concurrent fluorescence resonance energy transfer (FRET) and charge transfer quenching (CTQ) pathways. This may be achieved using the co-assembly of fluorescent dye moieties and redox-active moieties with QDs. A fluorescent dye is selected to be suitable as an acceptor for the QD acting as a donor in FRET; the redox-active moiety is selected to reversibly quench QD luminescence through electron or hole transfer, i.e. CTQ. The number and proximity of the fluorescent dye and redox-active moiety relative to the QD determines the efficiency of the FRET and CTQ processes, respectively.

It was found that FRET and CTQ can have (approximately) independent effects on the luminescence of the QD. Static modulation of the QD luminescence is achieved through the controlled assembly of different ratios of fluorescent dye and redox-active moiety with the QD. Dynamic modulation of the QD luminescence is achieved through the use of given ratios of fluorescent dye and redox active moiety per QD, assembled through a chemical or biomolecular linkage that can be broken or formed through chemically or biologically selective processes. This also highlights a potential application of these processes in biosensing. Other methods of joining the dye and redox active moiety can be employed, for example by layering and/or spin-coating. The effect of FRET and CTQ on the QD luminescence can be resolved by measurement of the luminescence intensity ratio between the fluorescent dye and QD, and the combined luminescence intensity of the QD and fluorescent dye, respectively.

In the case of FRET, QDs are most commonly used as donors, and the sensitization of luminescence from a fluorescent dye acceptor can also provide an analytical signal. The intensity of the dye luminescence can be measured absolutely, or relative to that of the QD (i.e., ratiometrically). As an alternative to steady-state intensity measurements, the measurement of QD luminescence decay time (i.e., fluorescence lifetime) can provide a measure of the extent of FRET or CTQ.

The technique described herein provides a general method for simultaneously modulating the luminescence of a single population/color of QD by using FRET in combination with CTQ. As seen in FIG. 1, a QD can be conjugated to both a fluorescent dye and a redox-active moiety, where the fluorescent dye is selected to be a suitable acceptor for a QD acting as a donor in FRET and the redox-active moiety is selected to be able to quench the luminescence of the QD via CTQ (i.e., electron or hole transfer). Preferably, to a first approximation, FRET and charge transfer are independent of one another.

The number of fluorescent dyes and redox-active moieties per QD, as well as their average distance from the QD, determines the rate and efficiency of both the FRET and CTQ pathways. QD luminescence can thus be modulated by changes in one or more of these parameters. Since the mechanistic differences of FRET and CTQ result in (approximately) independent effects of QD luminescence in this technique, the two pathways are distinguished on the following basis: changes in FRET efficiency alter the relative ratio of the QD and fluorescent dye (FRET-sensitization) luminescence intensities, whereas changes in CTQ alter the combined luminescence intensity of the QD and dye without altering the relative ratio of the two intensities. This provides two independent analytical parameters or readout modalities for both qualitative or quantitative analysis.

Figure 1A:
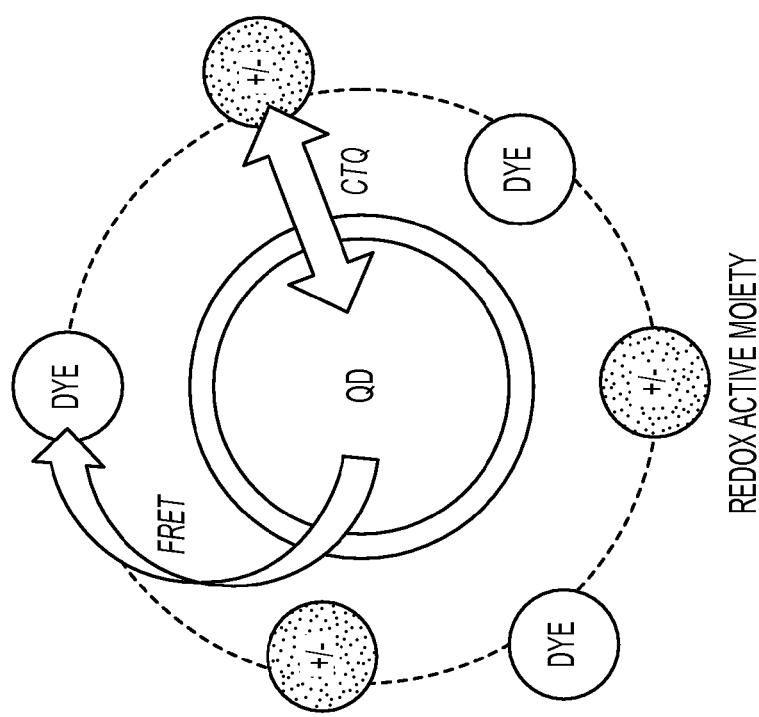
FIG. 1A shows a schematic outline for the described method: a QD is conjugated with a given number of fluorescent dye moieties (dye) and a given number of redox-active moieties (+/−).

FIG. 1A shows a schematic outline for the described method: a QD is conjugated with a given number of fluorescent dye moieties (dye) and a given number of redox-active moieties (+/−). The dye is selected to be an acceptor in FRET, with the QD as the donor. The redox-active moiety is selected to quench the QD luminescence by electron or hole transfer, i.e. CTQ.

If the QD/FRET and QD/charge transfer processes act independently, the following outcomes would be expected in the case of a Cy3 dye for FRET and ruthenium charge transfer: When adding more dye acceptor, the FRET efficiency should increase. For adding more electroactive ruthenium, the QD and Cy3 PL decrease while FRET efficiency stays the same. When removing dye acceptor, the Cy3 PL should decrease, the QD donor PL should increase, and the FRET efficiency should decrease. When removing electroactive ruthenium, the Cy3 acceptor PL should increase, the QD donor PL should increase, and the FRET efficiency should stay the same.

EXAMPLES

Static modulation of the QD luminescence was achieved through the controlled conjugation of different relative amounts of both a fluorescent dye, Cyanine 3 (Cy3), and redox-active moiety, ruthenium phenanthroline, to a central QD. In this embodiment, the Cy3 and ruthenium moieties are labels on peptides that are appended with a polyhistidine tag for controlled self-assembly to the shell of CdSe/ZnS QDs. Other methods of assembly—including other biomolecular linkers, biomolecular binding events (e.g. nucleic acid hybridization), or chemical coupling—can potentially modulate QD luminescence analogously, and are thus not beyond the scope of this technique.

FIG. 1B shows an exemplary reduction of the technique to practice, using polyhistidine appended peptides ($His_n$, in this example n=6), labeled with either a Cy3 fluorescent dye or a ruthenium (Ru) phenanthroline redox-active moiety, to drive the peptide and Cy3/Ru assembly with a CdSe/ZnS QD. In this particular example, the Ru acted as an electron donor upon photoexcitation of the QD.

Different ratios of Cy3 and ruthenium phenanthroline labeled peptides were assembled on water soluble CdSe/ZnS QDs and measured the resultant luminescence. It was found that the ratio of Cy3-to-QD luminescence increased with the assembly of more Cy3-labeled peptides, and that this ratio was largely invariant with changes in the number of ruthenium-labeled peptides that were co-assembled. In contrast, the magnitude of both the QD and FRET-sensitized Cy3 luminescence decreased with increased assembly of ruthenium-labeled peptides. Cumulatively, these two results reflect the apparent independence or orthogonality of these two processes with the same QD ensemble population.

Figure 2A:
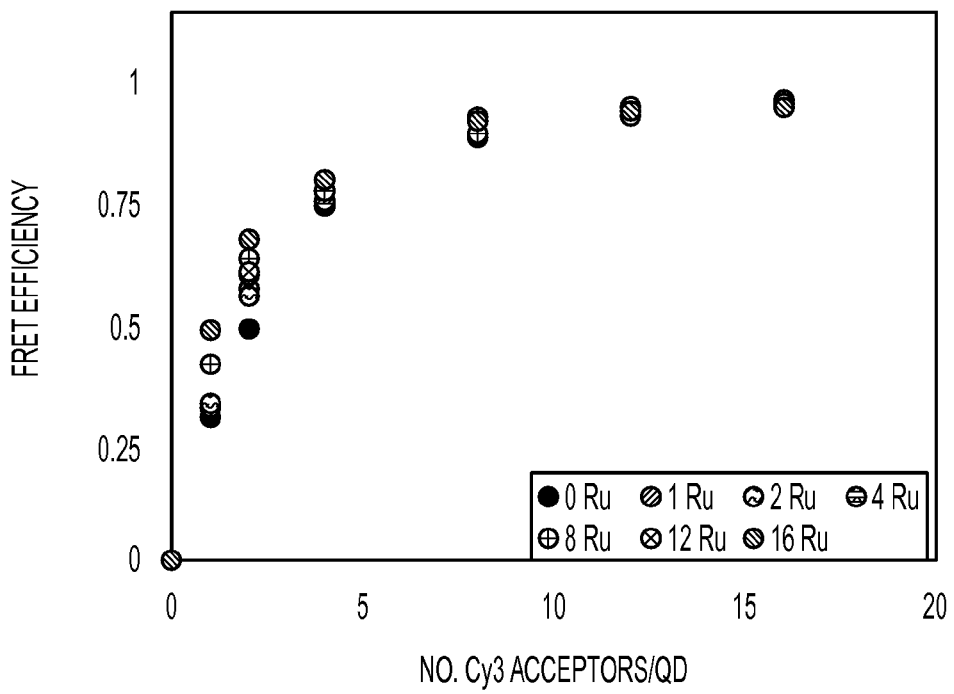
FIGS. 2A-2D show the results of varying the number of moieties bound to a QD.
Figure 2B:
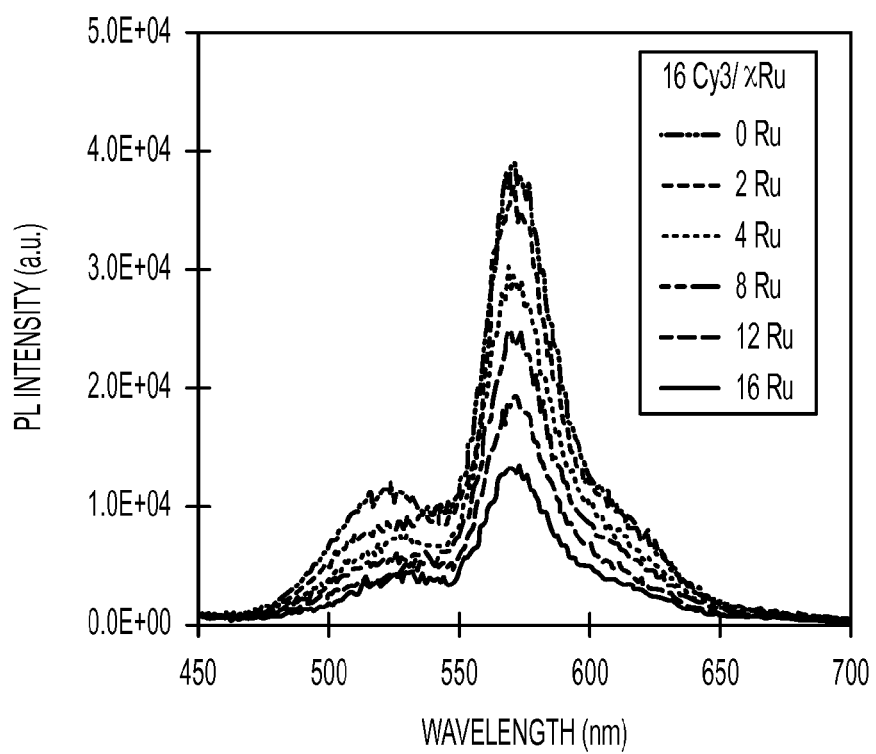
Figure 2C:
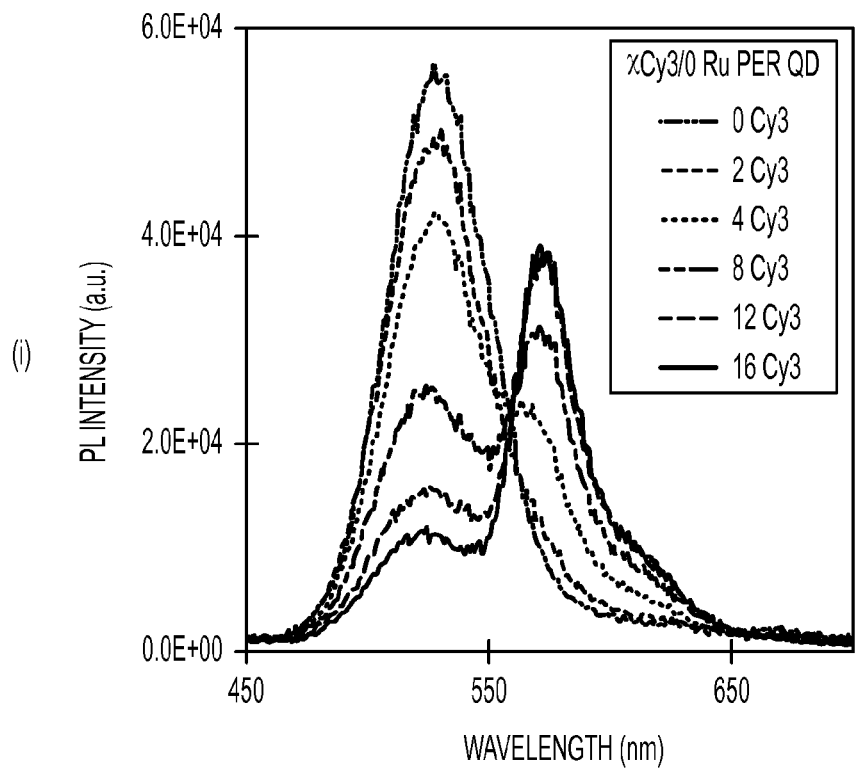
Figure 2D:
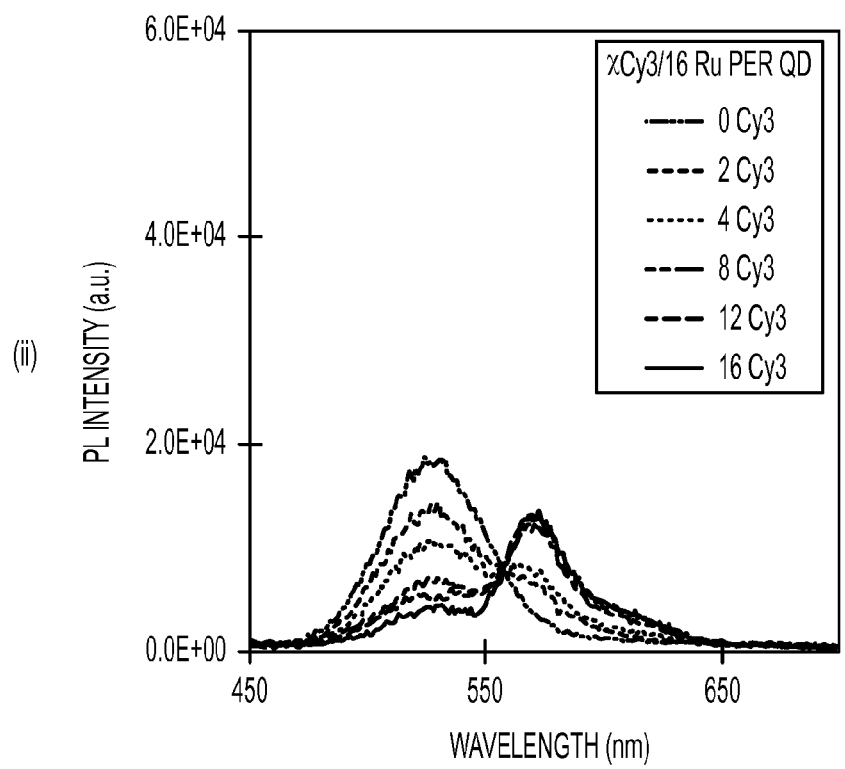

FIGS. 2A-2D show the results of varying the number of moieties bound to a QD, demonstrating that the FRET efficiency as a function of the number of Cy3 dyes per QD, and measured on the basis of the ratio of the QD and Cy3 luminescence intensities, is approximately independent of the ruthenium moieties per QD. FIG. 2A shows the effect of assembling an increasing number of Ru moieties around a QD acting as a FRET donor, as a function of the number of Cy3 FRET acceptors. FIG. 2B shows an example of the effect of increased assembly of Ru moieties on the highly-efficient FRET between each QD and an average of sixteen Cy3 acceptors. FIGS. 2C and 2D show the effect of assembling an increasing amount of Cy3 on QDs which are: (i) unquenched by Ru or (ii) strongly quenched by Ru. The same general trend and features are observed in comparing the two sets of PL spectra. The QDs were excited at 400 nm where direct excitation of the Cy3 was negligible. The data in this figure are representative of static modulation.

In general, dynamic modulation of the QD luminescence in this technique can also be achieved. Conjugates of QDs with fluorescent dye and redox-active moiety are prepared at predetermined ratios, as desired. The linkage between either the QD and fluorescent dyes, or the QD and redox-active moieties, is selected to be severable through chemical or biological means (e.g., through the use of a protease), such that this processes changes the efficiency of FRET or CT, respectively. This aspect of the technique was reduced to practice by assembling Cy3 and ruthenium phenanthroline to QDs using different peptide sequences, such that one of the peptide sequences is designed to be cleaved by the proteolytic activity of trypsin. The activity of trypsin can be monitored by dynamic changes in either the FRET efficiency derived from the luminescence intensity ratio between the QD and dye, or the combined intensity of the QD and Cy3, depending on whether the ruthenium-labeled or the Cy3-labeled peptide is specifically cleaved from the QD. In either case, the critical point is that the other parameter remains approximately invariant with trypsin activity. Of particular relevance in this example is that two independent signals are measured with a single population/color of QD conjugate.

In particular, the sequence CSTRIDEANQRATKLPPPP-PPPSHHHHH (SEQ ID No: 1) can be cleaved by trypsin at arginine and lysine sites. Another sequence CGWG-GAAAibLG (where Aib is the noncoded residue a-amino isobutyric acid) (SEQ ID No: 2) has been used with chymotrypsin cleaving at the tryptophan residue, providing similar results. Also used as a linker is the sequence $CAib_6G_2H_6$ (SEQ ID No: 3).

Figure 3A:
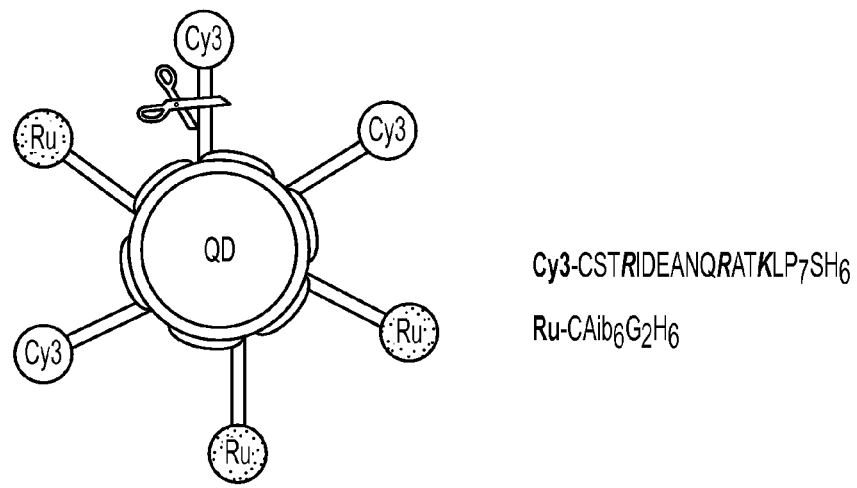
FIGS. 3A through 3E show the selective modulation of QD properties via removal of fluorescent dyes effective to perform FRET.
Figure 3B:
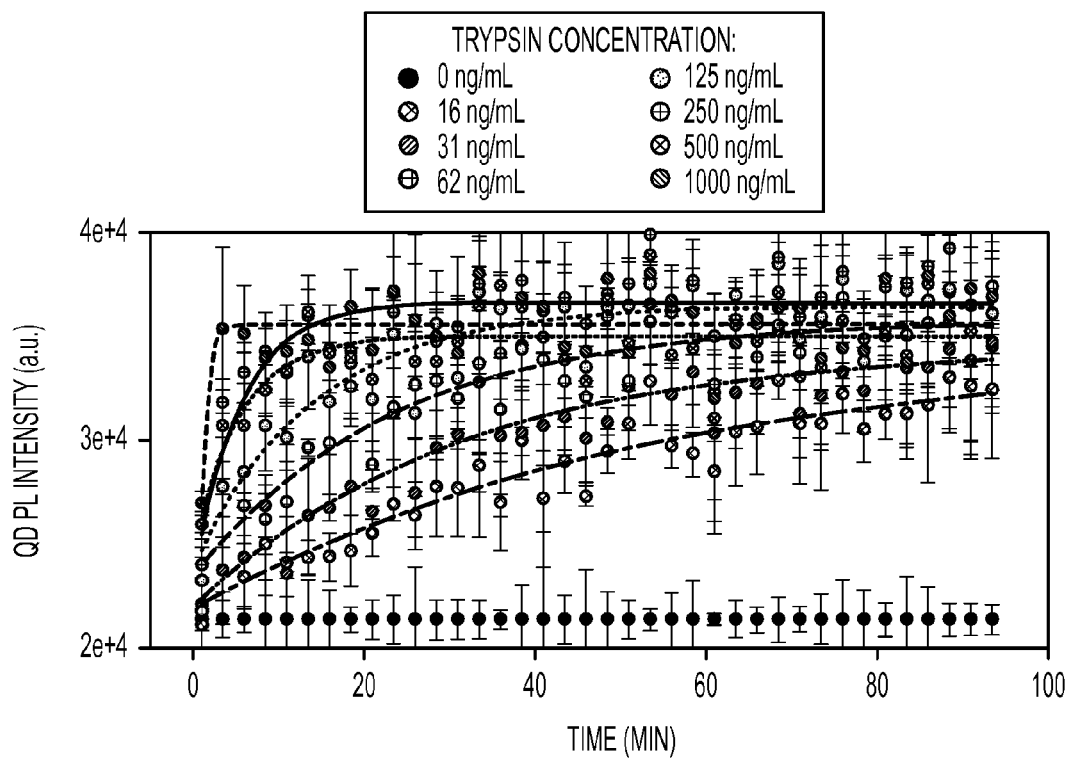
Figure 3C:
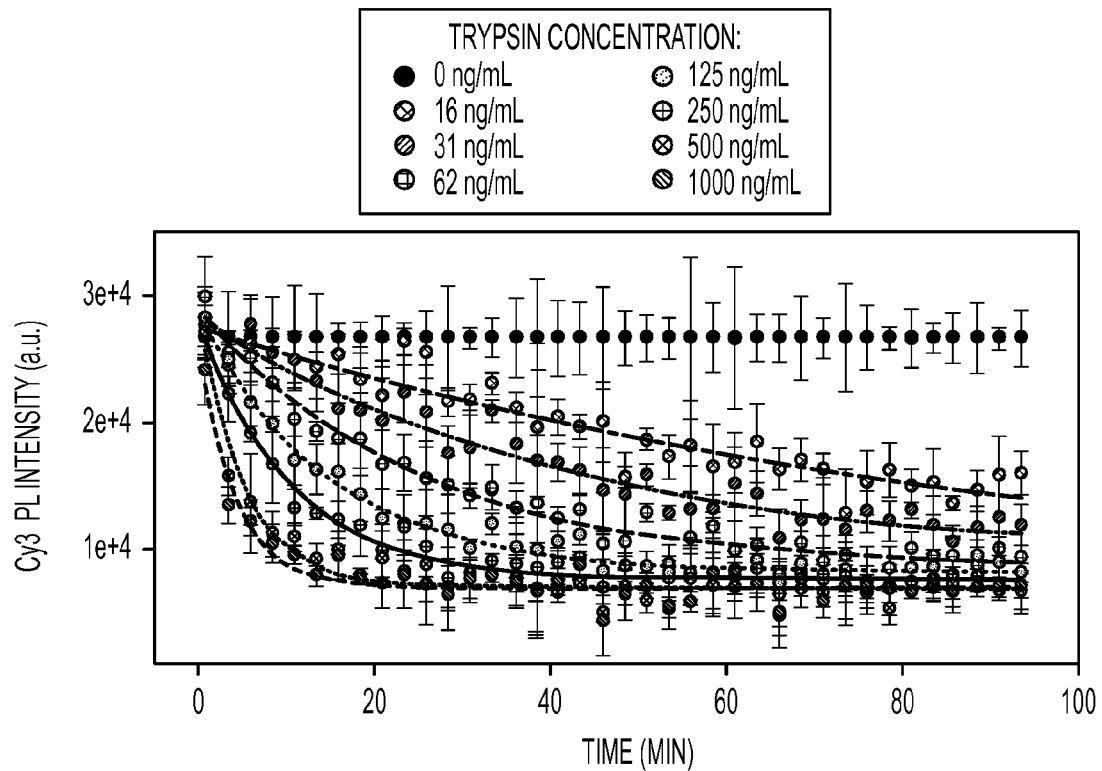
Figure 3D:
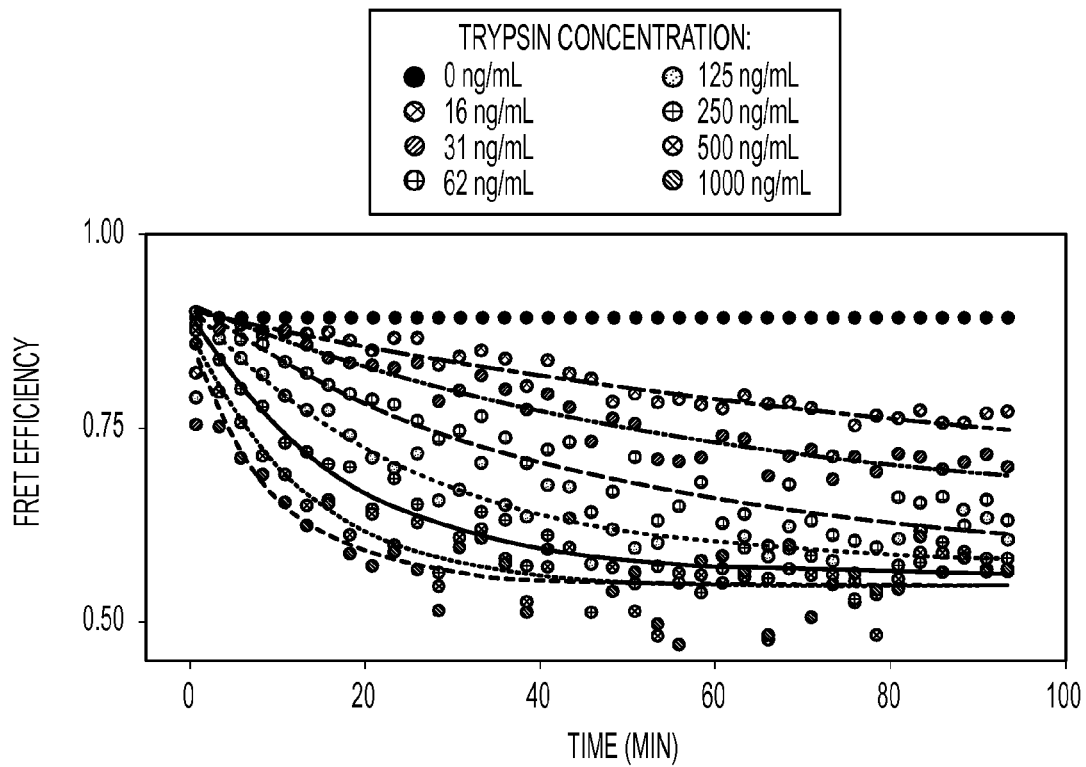
Figure 3E:
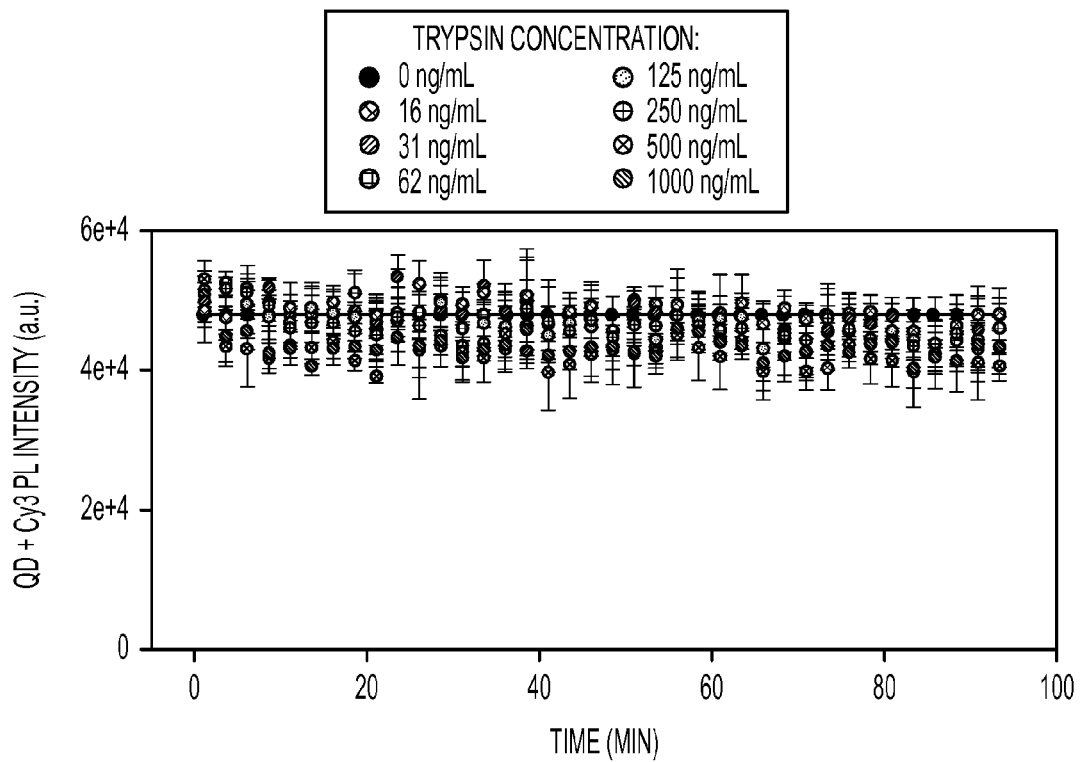

FIGS. 3A through 3E show the selective modulation of QD properties via removal of fluorescent dyes effective to perform FRET. In FIG. 3A, proteolytic activity (scissors representing a proteolytic enzyme such as trypsin) drives dynamic modulation through the disruption of FRET. The peptide sequences are shown for reference. Trypsin cutting sites are highlighted in bold italics. FIG. 3B shows changes in QD PL intensity as a function of time and trypsin concentration. FIG. 3C shows changes in Cy3 PL as a function of time and trypsin concentration. FIG. 3D shows changes in FRET efficiency as a function of time and trypsin concentration. FIG. 3E shows combined QD and Cy3 PL intensity as a function time and trypsin concentration. Note that, in this configuration, FRET efficiency is the analytical parameter that responds to cleavage of the Cy3 moieties from the QD and the loss of FRET.

Figure 4A:
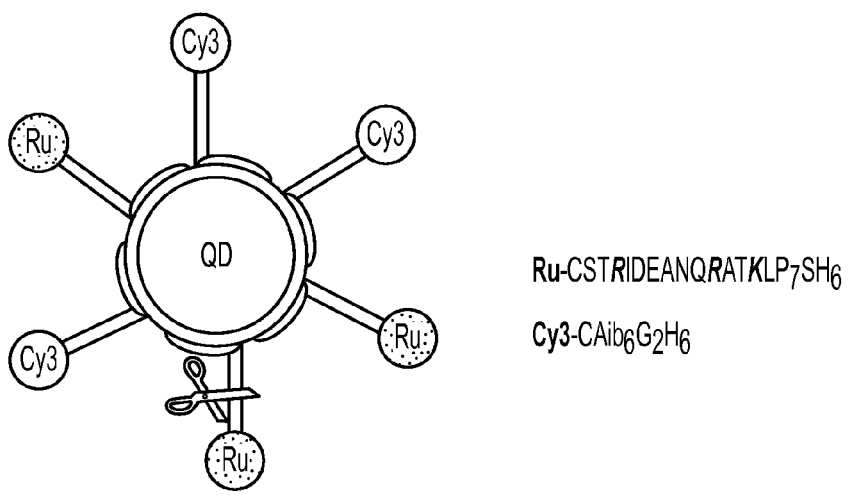
FIGS. 4A through 4E show the selective modulation of QD properties via removal of redox-active moieties effective to perform CTQ.
Figure 4B:
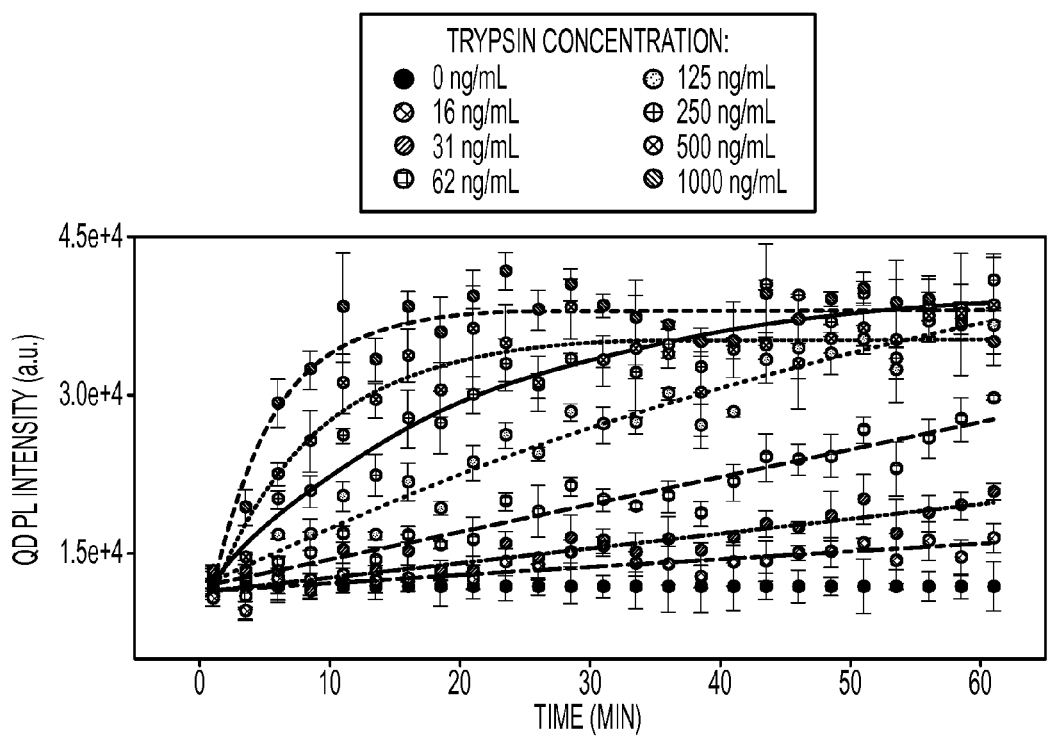
Figure 4C:
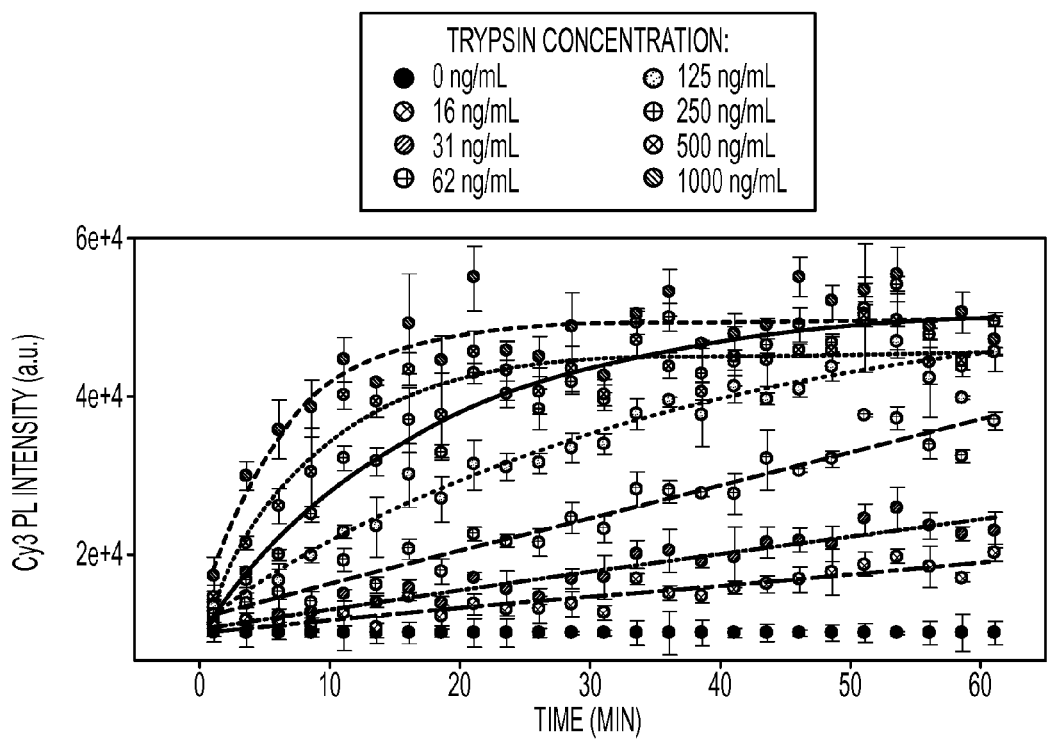
Figure 4D:
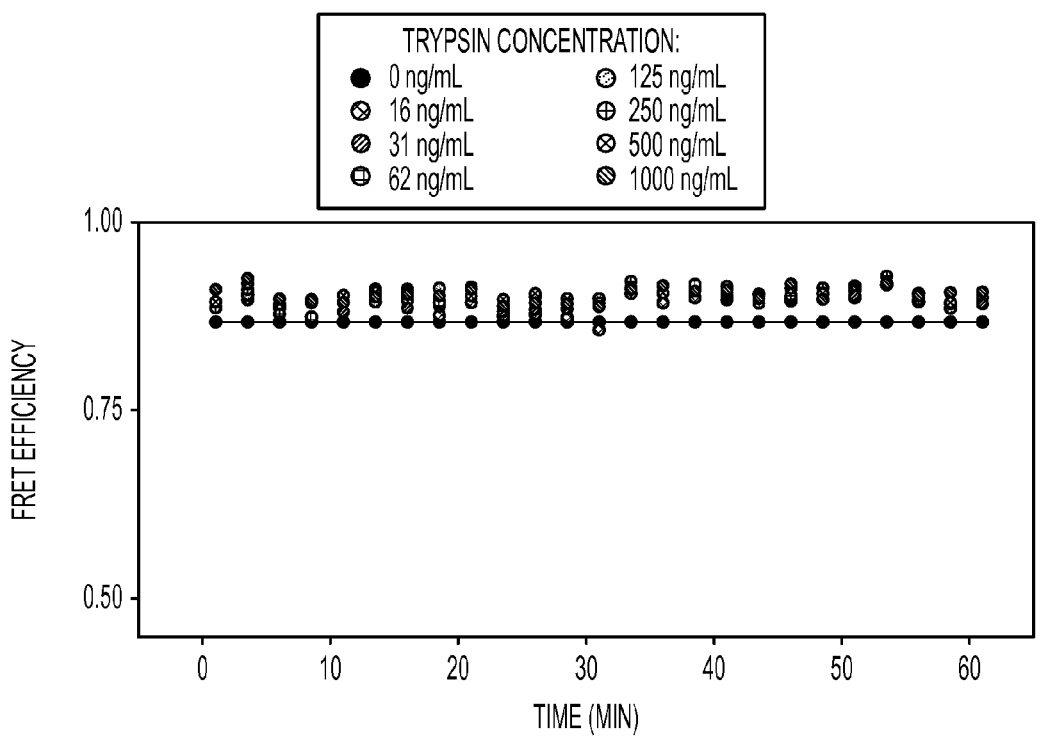
Figure 4E:
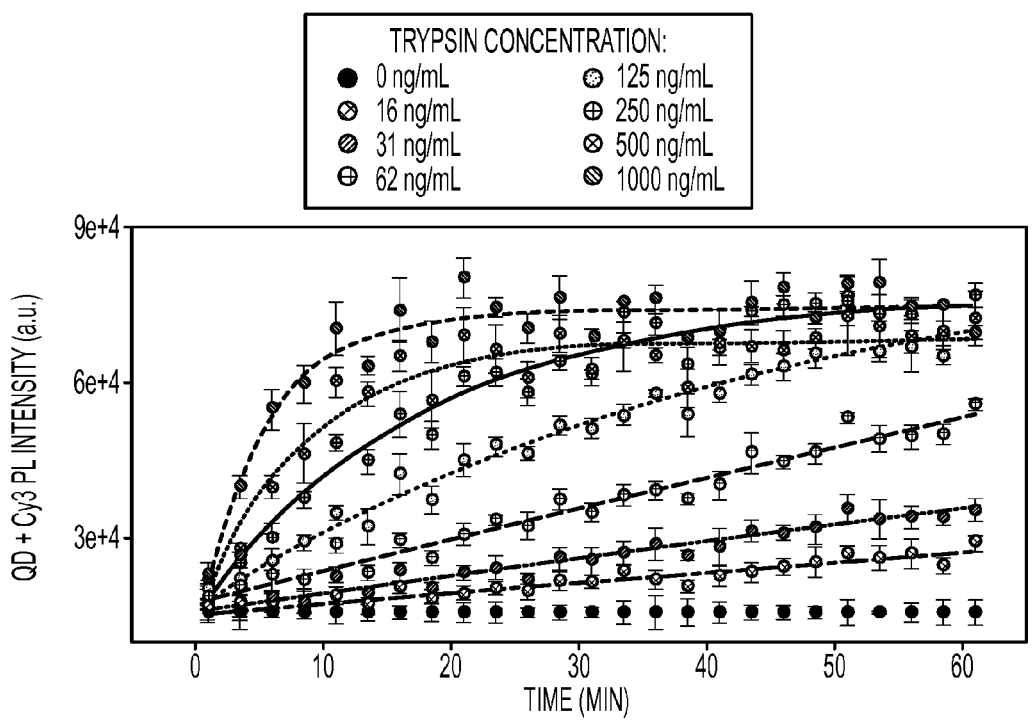

FIGS. 4A through 4E show the selective modulation of QD properties via removal of redox-active moieties effective to perform CTQ. It is pointed out that the ruthenium and Cy3 moieties are on the opposite ligands as in FIG. 3. FIG. 4A illustrates proteolytic activity (scissors=trypsin) to drive dynamic modulation through the disruption of CTQ. The peptide sequences are shown for reference. Trypsin cutting sites are highlighted in bold italics. FIG. 4B shows changes in QD PL intensity as a function of time and trypsin concentration. FIG. 4C shows changes in Cy3 PL as a function of time and trypsin concentration. FIG. 4D shows changes in FRET efficiency as a function of time and trypsin concentration. FIG. 4E shows combined QD and Cy3 PL intensity as a function time and trypsin concentration. In this configuration, the combined QD and Cy3 PL intensity is the analytical parameter that responds to cleavage of the Ru-moieties from the QD and the loss of CTQ.

ADDITIONAL EMBODIMENTS AND APPLICATIONS

Two distinct polyhistidine-appended peptides can be labeled with a fluorescent dye and redox-active moiety to control static and dynamic modulation of QD luminescence. The FRET/charge transfer processes is preferably applied in view of requisite energy levels.

The technique described herein provides a number of advantageous characteristics. Concurrent and (approximately) independent FRET and CTQ allow for two independent analytical signals. The color balance may be controlled without altering the QD or redox moiety concentrations. The use of different fluorescent dyes with variable spectral overlap with the QD (stronger/weaker quenching/enhancement based on FRET) can modulate or fine-tune QD luminescence as desired. The intensity of the QD and fluorescent dye luminescence can be controlled without altering QD or dye concentrations. The use of different redox-labels with variable redox potentials (stronger/weaker quenching/enhancement based on electron/hole acceptor properties) can modulate or fine-tune component QD luminescence as desired. The technique provides control over the effects/intensity of either FRET or CTQ on the QD PL via the number of each active moiety associated with the QD either independently or together. The creation of multi-color systems is possible by combining CTQ with different FRET pairs, each of the latter being comprised of different QD populations/colors conjugated to different fluorescent dyes. Only one excitation source is required to interrogate two (or more) analytical signals. A single appropriately modified QD population can act as a bifunctional (bio)sensor targeting two different (bio) processes for sensing via two different independent signal transduction modalities (for example, with two different proteases). Concurrent FRET and CTQ is accomplished in a manner that can potentially be used in solution, at an interface, within cellular environments, or embedded within matrices such as nanoparticles or polymeric films/coatings. Due to the high QD multi-photon action cross-sections, multi-photon excitation sources can be used to interrogate these QD conjugates allowing them to be embedded in environments/matrices that are opaque to conventional excitation sources. This has direct applications for forgery protection and authentication, and is valuable in the application such imaging and sensing in tissues or other biological media.

Beyond the peptides demonstrated here, a variety of other fluorescent dye- and redox-labeled biomolecules can be conjugated to QDs and then modulate QD luminescence. One of ordinary skill in the art can select a fluorescent dye that will be effective to perform fluorescence resonance energy transfer with the quantum dot being used. A variety of redox-labeled moieties can be used to modulate QD luminescence. Although examples described herein use ruthenium phenanthroline as a quencher, other suitable quenchers can be identified by one of ordinary skill in the art, for example using techniques described in Medintz et al., *J. Am. Chem. Soc.* 2008, 130, 16745-16756 and Medintz et al., *Nat Mater.* 2010 9,676-684 (the latter employing dopamine for CTQ). It is also possible to employ a modulator, such as a peptide or protein, to enhance PL emission, as described in, for example, Medintz et al., *Nat Mater.* 2003 September; 2(9):630-8 and references cited therein. Fluorescent dyes and redox-active moieties can be directly attached to QDs, i.e. chemically, to modulate QD luminescence.

Potential applications include areas where QDs are used as luminescent probes or reporters in biological or abiotic applications requiring, or benefiting from, two orthogonal pathways to modulate QD luminescence. This includes, but is not limited to: labeling of individual cells and populations of cells or tissues with different combinations/colors of QDs of variable intensity; components of biological assays; biosensors; and/or chemosensors; optical barcoding as a unique means of encoding in combinatorial chemistry schemes and high-throughput biological assays; optical barcoding as a unique identifier, authenticator, or forgery deterrent for documents, chemicals, materials and devices; and/or optical logic gates for computing.

The use of this technique to monitor proteolytic activity has been mentioned above. By varying the configuration of the three elements of the QD, redox-active moiety effective to perform charge transfer quenching, and fluorescent dye effective to perform fluorescence resonance energy transfer, it can also be used to monitor other biological processes, for example hybridization, enzymatic activity, or active or passive transport.

REFERENCES

Each of the following documents is incorporated herein by reference

Quantum Dots and Fluorescence Resonance Energy Transfer

W. R. Algar, U. J. Krull, "New opportunities in multiplexed optical bioanalyses using quantum dots and donor-acceptor interactions" Anal. Bioanal. Chem., 2010, 398, 2439-2449. (review)

W. R. Algar, A. J. Tavares, U. J. Krull, "Beyond labels: A review of the application of quantum dots as integrated components of assays, bioprobes, and biosensors utilizing optical transduction" Anal. Chim. Acta, 2010, 673, 1-25. (review)

I. L. Medintz, H. Mattoussi, "Quantum dot-based resonance energy transfer and its growing application in biology" Phys. Chem. Chem. Phys., 2009, 11, 17-45. (review)

K. E. Sapsford, L. Berti, I. L. Medintz, "Materials for fluorescence resonance energy transfer analysis: Beyond traditional donor-acceptor combinations" Angew. Chem. Int. Ed., 2006, 45, 4562-4588. (review)

Quantum Dots and Charge Transfer Quenching

W. R. Algar, U. J. Krull, "New opportunities in multiplexed optical bioanalyses using quantum dots and donor-acceptor interactions" Anal. Bioanal. Chem., 2010, 398, 2439-2449. (review)

W. R. Algar, A. J. Tavares, U. J. Krull, "Beyond labels: A review of the application of quantum dots as integrated components of assays, bioprobes, and biosensors utilizing optical transduction", Anal. Chim. Acta, 2010, 673, 1-25. (review)

I. L. Medintz, D. Farrell, K. Susumu, S. A. Trammell, J. R. Deschamps, F. M. Brunel, P. E. Dawson, H. Mattoussi, "Multiplex Charge-Transfer Interactions between Quantum Dots and Peptide-Bridged Ruthenium Complexes," Anal. Chem., 2009, 81, 4831-4839.

I. L. Medintz, T. Pons, S. A. Trammell, A. F. Grimes, D. S. English, J. B. Blanco-Canosa, P. E. Dawson, H. Mattoussi, "Interactions between Redox Complexes and Semiconductor Quantum Dots Coupled via a Peptide Bridge" J. Am. Chem. Soc., 2008, 130, 16745-16756.

M. G. Sandros, V. Shete, D. E. Benson, "Selective, reversible, reagentless maltose biosensing with core-shell semiconducting nanoparticles" Analyst, 2006, 131, 229-235.

CONCLUDING REMARKS

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

What is claimed is:

1. A method of modulating the photophysical properties of quantum dots, the method comprising:
contacting a uniform population of quantum dots with varying amounts of
(a) a redox-active moiety effective to perform charge transfer quenching, and
(b) a fluorescent dye effective to perform fluorescence resonance energy transfer,
thereby obtaining modified quantum dots having a variety of photophysical properties.

2. The method of claim 1, wherein said fluorescent dye acts as a FRET acceptor.

3. The method of claim 1, wherein said redox-active moiety is ruthenium phenanthroline.

4. The method of claim 1, wherein either or both of said fluorescent dye and said redox-active moiety are severable through the use of a protease.

5. A method of modulating the photophysical properties of quantum dots, the method comprising:
providing a uniform population of modified quantum dots, the uniform population comprising quantum dots modified with
(a) a redox-active moiety effective to perform charge transfer quenching, and
(b) a fluorescent dye effective to perform fluorescence resonance energy transfer; and
selectively removing the redox-active moiety and/or the fluorescent dye, thereby obtaining modified quantum dots having a variety of photophysical properties.

6. The method of claim 5, further comprising preparing said modified quantum dots by contacting a uniform population of quantum dots with
(a) a redox-active moiety effective to perform charge transfer quenching, and
(b) a fluorescent dye suitable modulator of photoluminescence to produce a plurality of optical barcodes.

7. The method of claim 5, wherein the selective removal comprises proteolysis.

8. The method of claim 5, wherein said fluorescent dye acts as a FRET acceptor.

9. The method of claim 5, wherein said redox-active moiety is ruthenium phenanthroline.

* * * * *

```
SEQUENCE LISTING

<160> NUMBER OF SEQ ID NOS: 3

<210> SEQ ID NO 1
<211> LENGTH: 28
<212> TYPE: PRT
<213> ORGANISM: Artificial Sequence
<220> FEATURE:
<223> OTHER INFORMATION: synthetic construct

<400> SEQUENCE: 1

Cys Ser Thr Arg Ile Asp Glu Ala Asn Gln Arg Ala Thr Lys Leu Pro
1               5                   10                  15

Pro Pro Pro Pro Pro Pro Ser His His His His His
            20                  25

<210> SEQ ID NO 2
<211> LENGTH: 10
<212> TYPE: PRT
<213> ORGANISM: Artificial Sequence
<220> FEATURE:
<223> OTHER INFORMATION: synthetic construct
<220> FEATURE:
<221> NAME/KEY: MISC_FEATURE
<222> LOCATION: (8)..(8)
<223> OTHER INFORMATION: alpha-amino isobutyric acid

<400> SEQUENCE: 2

Cys Gly Trp Gly Gly Ala Ala Xaa Leu Gly
1               5                   10

<210> SEQ ID NO 3
<211> LENGTH: 11
<212> TYPE: PRT
<213> ORGANISM: Artificial Sequence
<220> FEATURE:
<223> OTHER INFORMATION: synthetic construct
<220> FEATURE:
<221> NAME/KEY: MISC_FEATURE
<222> LOCATION: (2)..(7)
<223> OTHER INFORMATION: alpha-amino isobutyric acid

<400> SEQUENCE: 3

Cys Xaa Xaa Xaa Xaa Xaa Xaa Gly Gly His His
1               5                   10
```